(12) United States Patent
Kim et al.

(10) Patent No.: US 8,044,696 B2
(45) Date of Patent: Oct. 25, 2011

(54) DELAY CIRCUIT HAVING LONG DELAY TIME AND SEMICONDUCTOR DEVICE COMPRISING THE SAME

(75) Inventors: Tae-Hyung Kim, Hwaseong-si (KR); Min-Su Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 99 days.

(21) Appl. No.: 12/391,959

(22) Filed: Feb. 24, 2009

(65) Prior Publication Data

US 2009/0212838 A1    Aug. 27, 2009

(30) Foreign Application Priority Data

Feb. 25, 2008    (KR) .................. 10-2008-0016984

(51) Int. Cl.
*H03H 11/26*    (2006.01)
(52) U.S. Cl. ...................................... 327/261
(58) Field of Classification Search .................. None
See application file for complete search history.

(56) References Cited

U.S. PATENT DOCUMENTS

| | | | | |
|---|---|---|---|---|
| 4,922,141 A * | 5/1990 | Lofgren et al. | ............... | 327/158 |
| 5,051,630 A * | 9/1991 | Kogan et al. | .................. | 327/262 |
| 5,459,424 A * | 10/1995 | Hattori | ......................... | 327/278 |
| 6,044,027 A * | 3/2000 | Zheng et al. | .................. | 365/194 |
| 6,147,536 A * | 11/2000 | Jeong | ............................. | 327/283 |
| 6,154,078 A * | 11/2000 | Stave | ............................ | 327/263 |
| 6,515,529 B2 * | 2/2003 | Stave | ............................ | 327/263 |
| 6,650,574 B2 * | 11/2003 | Namekawa | .................. | 365/194 |
| 6,958,641 B2 * | 10/2005 | Lee | ................................ | 327/261 |
| 7,394,302 B2 * | 7/2008 | Shimazawa | ................... | 327/277 |
| 7,557,631 B2 * | 7/2009 | Sinha et al. | .................... | 327/261 |
| 2005/0001667 A1 * | 1/2005 | Lee | ................................ | 327/261 |
| 2009/0261879 A1 * | 10/2009 | Sinha et al. | .................... | 327/261 |

FOREIGN PATENT DOCUMENTS

| | | |
|---|---|---|
| JP | 57-012485 | 1/1982 |
| JP | 06-314960 | 11/1994 |
| KR | 1020000065618 | 11/2000 |

OTHER PUBLICATIONS

English Abstract for Publication No. 57-012485.
English Abstract for Publication No. 06-314960.
English Abstract for Publication No. 1020000065618.

* cited by examiner

*Primary Examiner* — Lincoln Donovan
*Assistant Examiner* — Khareem E Almo
(74) *Attorney, Agent, or Firm* — F. Chau & Associates, LLC (57) ABSTRACT

A delay circuit has a long delay time and a semiconductor device includes the delay circuit. The delay circuit includes an inverter circuit unit having at least one inverter. Each of the inverters includes a first transistor connected to a supply voltage and a second transistor connected to a ground voltage. The inverter circuit unit receives a first signal and outputs a second signal by delaying the first signal. At least one capacitor unit is connected to an input terminal of the inverter such that a loading capacitance of the inverter circuit unit is increased.

10 Claims, 8 Drawing Sheets

DELAY CIRCUIT HAVING LONG DELAY TIME AND SEMICONDUCTOR DEVICE COMPRISING THE SAME

CROSS-REFERENCE TO RELATED APPLICATION

This application claims priority to and the benefit of Korean Patent Application No. 10-2008-0016984, filed on Feb. 25, 2008, in the Korean Intellectual Property Office, the entire content of which is incorporated herein by reference.

BACKGROUND

The present invention relates to semiconductor devices, and more particularly, to a delay circuit and a semiconductor device including the delay circuit.

Delay circuits which are widely used in semiconductor devices are generally implemented using complementary metal oxide semiconductor (CMOS) inverters. The term "minimum feature size" used in the field of semiconductor devices refers to the minimum length of lines in semiconductor devices according to the design rules for semiconductor manufacturing processes.

With the development of semiconductor technology, the minimum feature size has been decreased to 180 nm, 90 nm, and 65 nm, and thus a gate length has decreased to the minimum feature size. The decrease of the minimum feature size may change the characteristics of the semiconductor devices. In particular, the characteristics of transistors of CMOS inverters largely vary according to gate length variations. Generally, polysilicon is used for the gate of CMOS inverters. To reduce characteristics variations of the transistors, pitches of polymers applied on the gate need to be uniformly controlled.

A delay circuit, such as a hold buffer which may be generally used for a semiconductor device, includes at least one CMOS inverter and should have a long delay time. Accordingly, even though the gate length of circuits generally used for semiconductor devices has the minimum feature size, the delay time of circuits which require a long delay time, such as the hold buffer, can be increased by increasing the gate length. However, since the gates of circuits of the semiconductor device have different lengths, it becomes difficult to uniformly control the pitch of polymers. Thus, the characteristics of the transistors may be changed.

Figure 1:
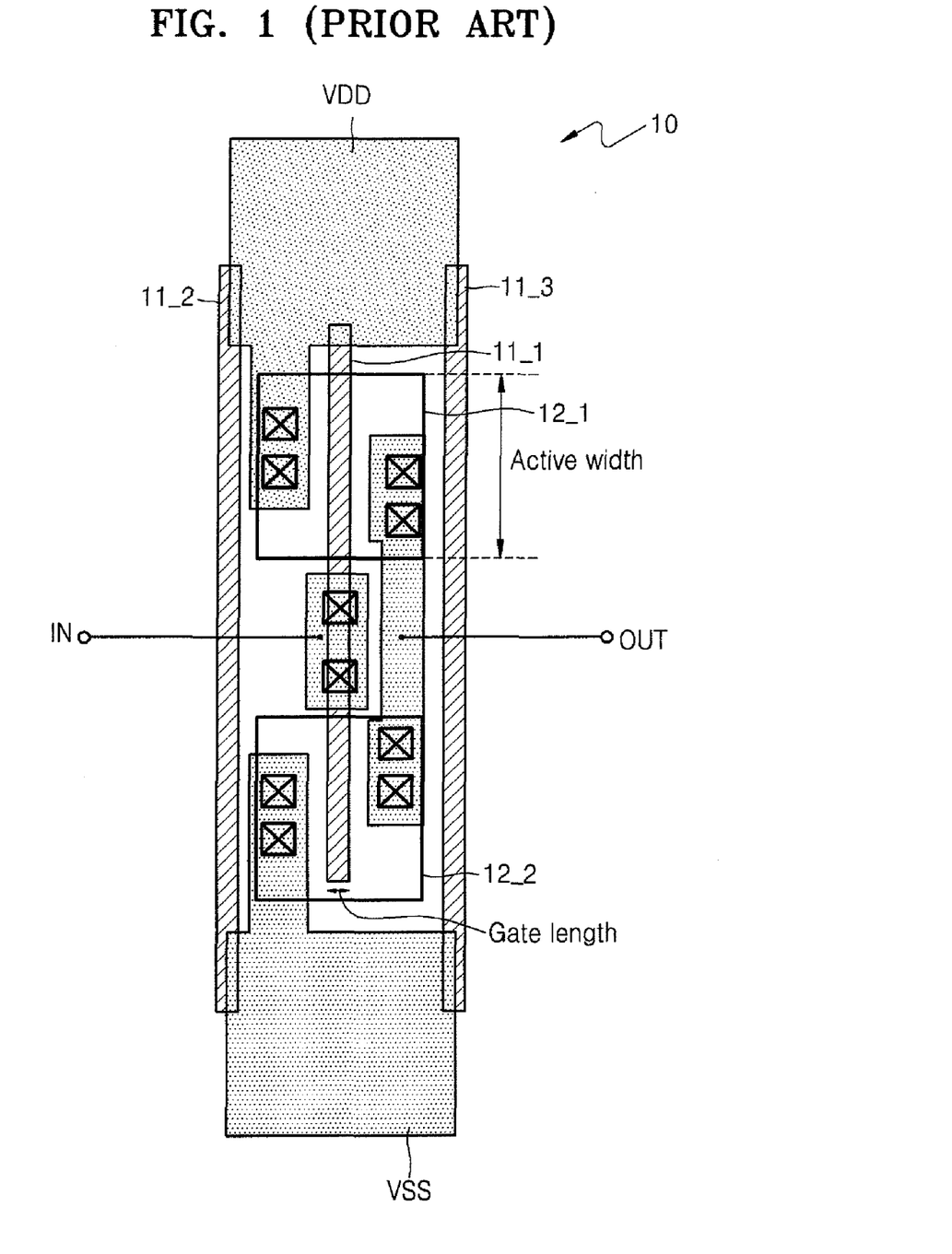
FIG. 1 shows a layout of a conventional inverter.

FIG. 1 shows the layout of a conventional inverter 10. The conventional inverter 10 includes a line supplying a supply voltage VDD, a line supplying a ground voltage VSS, a PMOS transistor formed in an active region 12_1 in the vicinity of the line supplying the supply voltage VDD, and an NMOS transistor formed in an active region 12_2 in the vicinity of the line supplying the ground voltage VSS. Polymer lines 11_1 to 11_3 include a gate line 11_1 and dummy polymer lines 11_2 and 11_3.

A source electrode of the PMOS transistor may be connected to a metal line supplying a supply voltage VDD through a via hole, and a drain electrode of the PMOS transistor may be connected to a metal line supplying an output signal through a via hole. In addition, a source electrode of the NMOS transistor may be connected to a metal line supplying a ground voltage VSS through a via hole, and a drain electrode of the NMOS transistor may be connected to a metal line supplying an output signal through a via. A metal line supplying an input signal may be connected the gate line 11_1 through a via hole.

Since the gate length of the inverter shown in FIG. 1 has the minimum feature size, characteristics of the transistors may not be largely changed due to uniform intervals between polymer lines even though delay time is minimized. However, to increase the delay time when the gate length has the minimum feature size, the inverter needs to have a plurality of stages. Thus, the number of circuits has to be increased and also the area of the inverter has to be increased.

Figure 2:
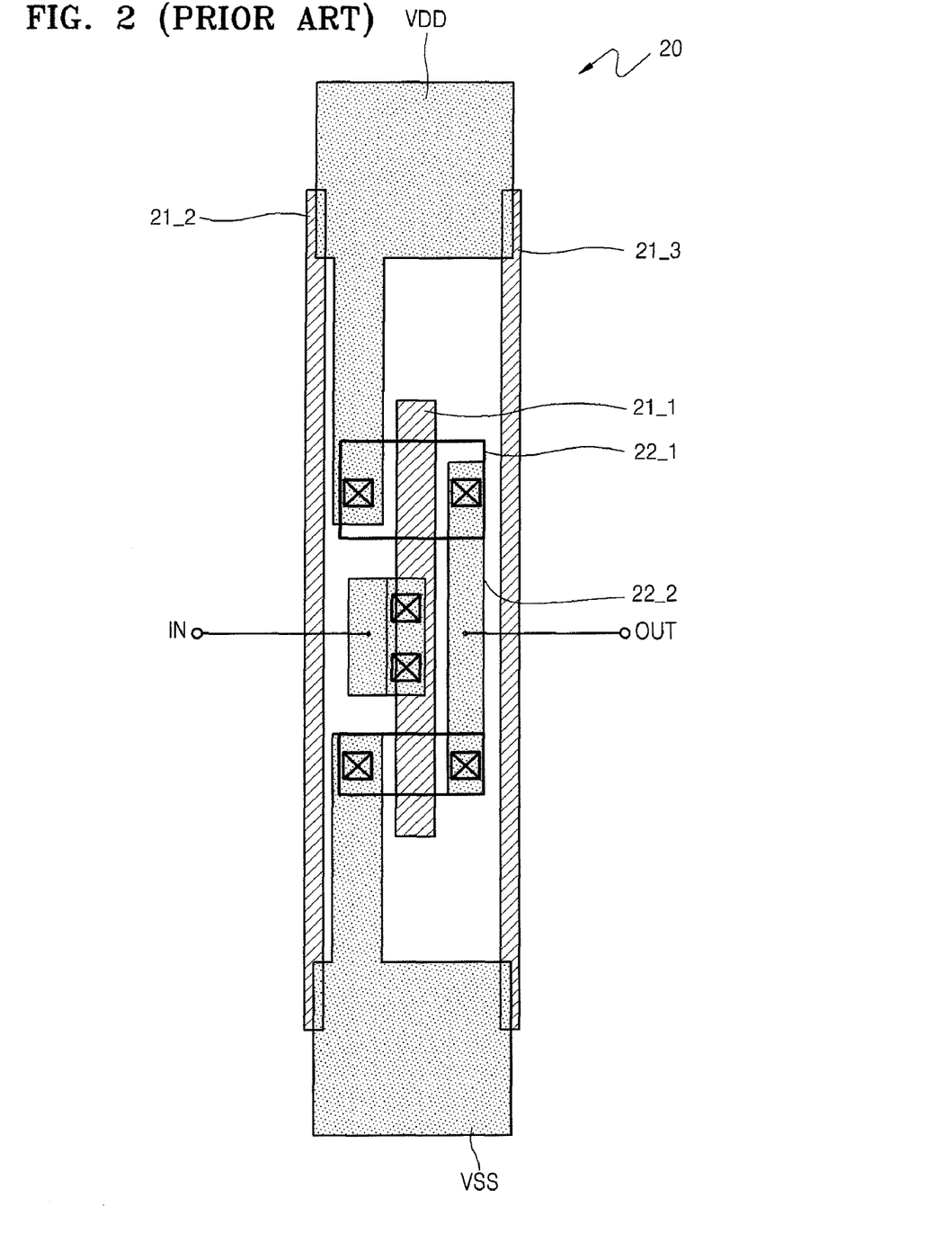
FIG. 2 shows a layout of a conventional inverter having a long delay time.

FIG. 2 shows a layout of a conventional inverter 20 having a long delay time. The inverter 20 has a gate line length larger, for example, twice larger, than the gate line 11_1 of the inverter 10 shown in FIG. 1, and the dummy polymers 21_2 and 21_3 of the inverter 20 have the same minimum feature size. In addition, an active width of active regions 22_1 and 22_2 of the inverter 20 is smaller than that of the inverter 10.

That is, in the case of the inverter 20, the delay time can be increased by increasing the length of the gate line 21_1 and decreasing the active width of the active regions 22_1 and 22_2. However, since the pitch of the polymers is not maintained constant as the length of the gate line 21_1 of the inverter 20 is increased, the characteristics of the transistors become changed.

SUMMARY

In accordance with an exemplary embodiment of the present invention a delay circuit is provided having a gate length equal to the minimum feature size and increased delay time. A semiconductor device including the delay circuit is also provided.

In accordance with an exemplary embodiment of the present invention, there is provided a delay circuit including an inverter circuit unit having at least one inverter. Each inverter includes a first transistor connected to a supply voltage and a second transistor connected to a ground voltage. At least one capacitor unit is connected to the at least one inverter, the at least one capacitor unit providing a loading capacitance to the inverter circuit unit. The inverter circuit unit, in response to receiving an input signal, outputs an output signal having a delay from the input signal, the delay corresponding to the loading capacitance.

The at least one capacitor unit may include at least one first capacitor which includes a first electrode connected to the supply voltage and a second electrode connected to a gate electrode of the first transistor.

The at least one capacitor unit may include at least one second capacitor which includes a first electrode connected to the ground voltage and a second electrode connected to a gate electrode of the second transistor.

The inverter circuit unit may include a first inverter which receives the input signal, inverts the input signal, and outputs a first inverted signal. A second inverter receives the first inverted signal, inverts the first inverted signal output, and outputs a second inverted signal. A third inverter receives the second inverted signal, inverts the second inverted signal, and outputs a third inverted signal. A fourth inverter receives the third inverted signal, inverts the third inverted signal, and outputs a fourth inverted signal.

The input terminal of the at least one of the first to fourth inverters may be connected to at least one of the first capacitor and the second capacitor.

The first capacitor may be a PMOS transistor including PMOS source and drain electrodes connected to the supply voltage and a PMOS gate electrode connected to the gate electrode of the first transistor. The second capacitor may be an NMOS transistor including NMOS source and drain electrodes connected to the ground voltage and an NMOS gate electrode connected to the gate electrode of the second transistor.

The delay circuit may include a first active region adjacent to a first conductive line that provides the supply voltage and is electrically connected to the first conductive line; a second active region adjacent to a second conductive line that provides the ground voltage and is electrically connected to the second conductive line; at least one first gate line crossing the first active region and the second active region and forming the first transistor and the second transistor; a third active region in a region adjacent to the first conductive line in which the at least one inverter is not aligned, and is electrically connected to the first conductive line; and at least one second gate line crossing the third active region such that the at least one capacitor is formed.

The delay circuit may further include a plurality of contacts in the third active region connecting the third active region and the first conductive line, and the second gate line being between the plurality of contacts such that a plurality of capacitors is formed.

The delay circuit may further include a fourth active region which is formed in a region adjacent to the second conductive line in which the inverter is not aligned, is electrically connected to the second conductive line through at least one contact, and forms at least one capacitor with the at least one second gate line.

A plurality of contacts may be in the fourth active region for the connection between the fourth active region and the second conductive line, and the second gate line may be between the plurality of contacts to form a plurality of capacitors.

The length of the first gate line and the second gate line may have a minimum feature size.

According to another exemplary embodiment of the present invention, there is provided a delay circuit having an inverter circuit unit which includes at least one inverter stage. Each inverter stage includes a pull-up transistor that switches a first voltage, and a pull-down transistor that switches a second voltage, the pull-down transistor being coupled in series to the pull-up transistor. A resistance unit is connected to at least one inverter stage and has a predetermined resistance independent of an input signal to the inverter circuit unit. The inverter circuit unit, in response to receiving the input signal, outputs an output signal having a delay from the input signal, the delay corresponding to the predetermined resistance.

According to yet another exemplary embodiment of the present invention, there is provided a method for delaying a signal. The method includes: providing an inverter circuit unit having at least one inverter, each inverter having a first transistor connected to a supply voltage and a second transistor connected to a ground voltage, coupling: at least one capacitor unit to the at least one inverter, the at least one capacitor unit providing a loading capacitance to the inverter circuit unit, or a resistance unit to at least one inverter stage, the resistance unit having a predetermined resistance independent of an input signal to the inverter circuit, inputting an input signal to the inverter circuit; and outputting an output signal, the output signal: having a delay from the input signal, the delay corresponding to the loading capacitance if the at least one capacitor unit is coupled to the at least one inverter, or having a delay from the input signal, the delay corresponding to the predetermined resistance if the resistance unit is coupled to the at least one inverter stage.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EMBODIMENTS

Hereinafter, the present invention will be described more fully with reference to the accompanying drawings, in which exemplary embodiments of the present invention are shown. In the drawings like reference numerals denote like elements.

Figure 3:
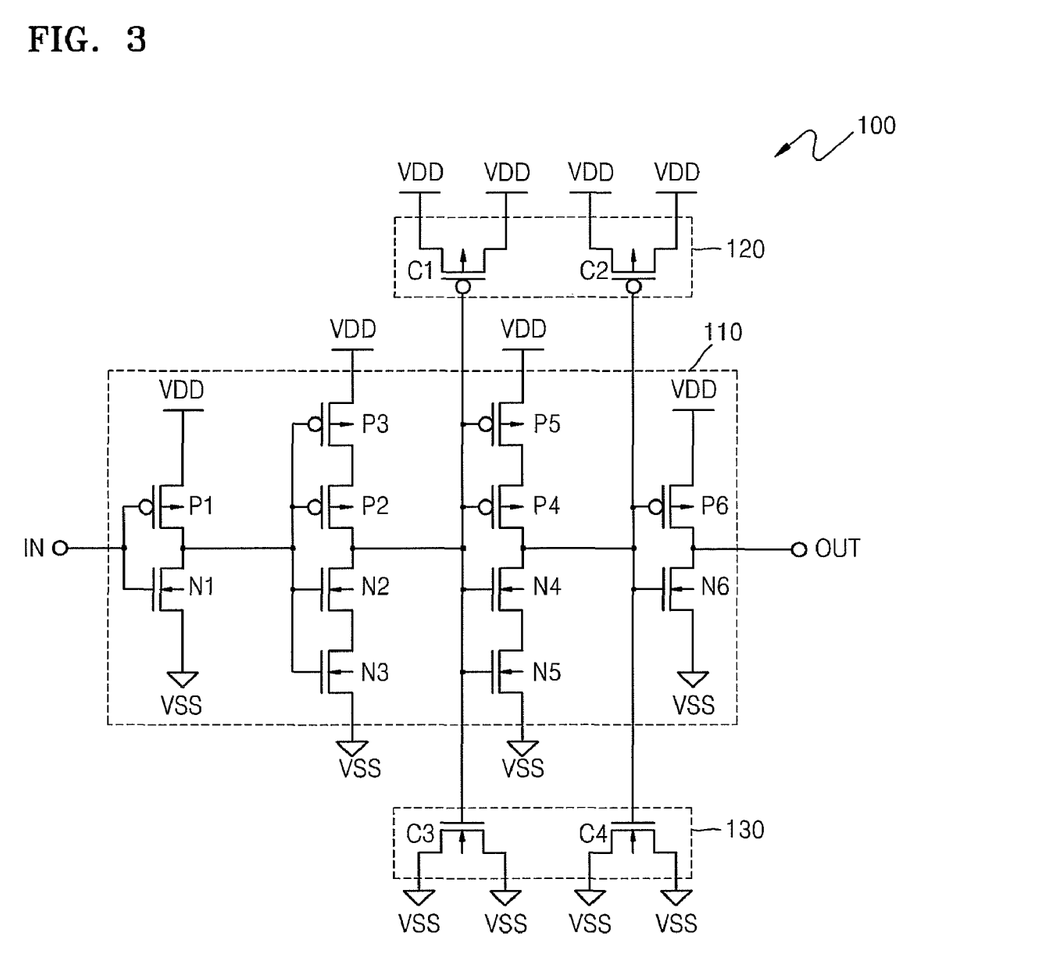
FIG. 3 shows a circuit diagram of a delay circuit according to an exemplary embodiment of the present invention.

Referring now to FIG. 3, the delay circuit 100 includes an inverter circuit unit 110 which receives an input signal IN and outputs an output signal OUT by delaying the input signal IN for a predetermined period of time; and at least one capacitor 120, 130 which is electrically connected to the inverter circuit unit 110 to increase the loading capacitance of the inverter circuit unit 110.

The inverter circuit unit 110 may include at least one CMOS inverter. FIG. 3 illustrates an inverter circuit unit 110 including four CMOS inverters. In addition, the capacitors 120, 130 are connected to the third inverter stage and the fourth inverter stage of the four CMOS inverters. However, the delay circuit shown in FIG. 3 is merely one exemplary embodiment of the present invention. Those skilled in the art would appreciate that various modifications can be implemented. For example, to increase the delay time of the delay circuit, the number of inverter stages may be increased, and the capacitor(s) may be connected to another inverter stage or to additional inverter stages.

As an element of the inverter circuit unit 110, a first inverter stage may include a PMOS transistor P1 which receives the input signal IN and is connected to the supply voltage VDD and an NMOS transistor N1 which is connected to the ground voltage VSS. In addition, a second inverter stage may include PMOS transistors P2, P3 which receive the signal output from the first inverter stage and are connected to the supply voltage VDD and NMOS transistors N2, N3 which are connected to the ground voltage VSS. Furthermore, a third inverter stage may include PMOS transistors P4, P5 which receive the signal output from the second inverter stage and are connected to the supply voltage VDD and NMOS transistors N4, N5 which are connected to the ground voltage VSS. In addition, a fourth inverter stage may include a PMOS transistor P6 which receives the signal output from the third inverter stage, outputs an output signal OUT of the inverter circuit unit 110, and is connected to the supply voltage VDD, and an NMOS transistor N6 which is connected to the ground voltage VSS.

The inverter circuit unit 110 of the delay circuit 100 may be implemented as described above, and the delay time of the delay circuit 100 may be controlled by varying the resistance and capacitance. That is, D (delay time)=R (resistance)*C (capacitance). While the delay time is decreased in a typical logic circuit by decreasing the resistance and the capacitance, the delay time is increased in a delay circuit, such as a hold buffer, by increasing the resistance and the capacitance.

According to an exemplary embodiment of the present invention, variations of the characteristics of transistors may be minimized by forming the length of a gate aligned in the inverter circuit unit 110 with a size corresponding to a minimum feature size. On the other hand, the delay time of the delay circuit 100 is increased by raising the loading capacitance of the inverter circuit unit 100 using the capacitors 120, 130.

In an exemplary embodiment, the capacitor units 120, 130 may be implemented using MOS transistors. In addition, the capacitor units 120, 130 may include a first capacitor unit 120 connected to the supply voltage VDD and a second capacitor unit 130 connected to the ground voltage VSS. Each of the capacitors C1, C2 of the first capacitor unit 120 may be connected to a gate electrode of a PMOS transistor formed in each of the inverters. For example, a first electrode of the capacitor C1 (i.e., the source and drain of the MOS transistor) is connected to the supply voltage VDD, a second electrode of the capacitor C1 (i.e., the gate of the MOS transistor) is connected to a gate electrode of PMOS transistors P4, P5 of the third inverter stage. Similarly, a first electrode of the capacitor C2 is connected to the supply voltage VDD, and a second electrode of the capacitor C2 is connected to a gate electrode of a PMOS transistor P6 of the fourth inverter stage.

Each of the capacitors C3, C4 of the second capacitor unit 130 may be connected to a gate electrode of the NMOS transistor in each of the inverters. For example, a first electrode of the capacitor C3 (i.e., the source and drain of the MOS transistor) is connected to the ground voltage VSS, a second electrode of the capacitor C3 (i.e., the gate of the MOS transistor) may be connected to a gate electrode of NMOS transistors N4, N5 of the third inverter stage. Similarly, a first electrode of the capacitor C4 is connected to the ground voltage VSS, and a second electrode of the capacitor C4 is connected to a gate electrode of the NMOS transistor N6 of the fourth inverter stage.

As described above, an input terminal of at least one inverter of the inverter circuit unit 110 is connected to the capacitor. Accordingly, the loading capacitance of the inverter circuit unit 110 is increased, and thus the delay time of the inverter circuit unit 110 is increased. That is, the delay circuit 100 may have a long delay time by increasing the loading capacitance of the inverter circuit unit 110 instead of minimizing the characteristics variations of the transistors by increasing the gate length in the layout for implementing the delay circuit 100.

Figure 4:
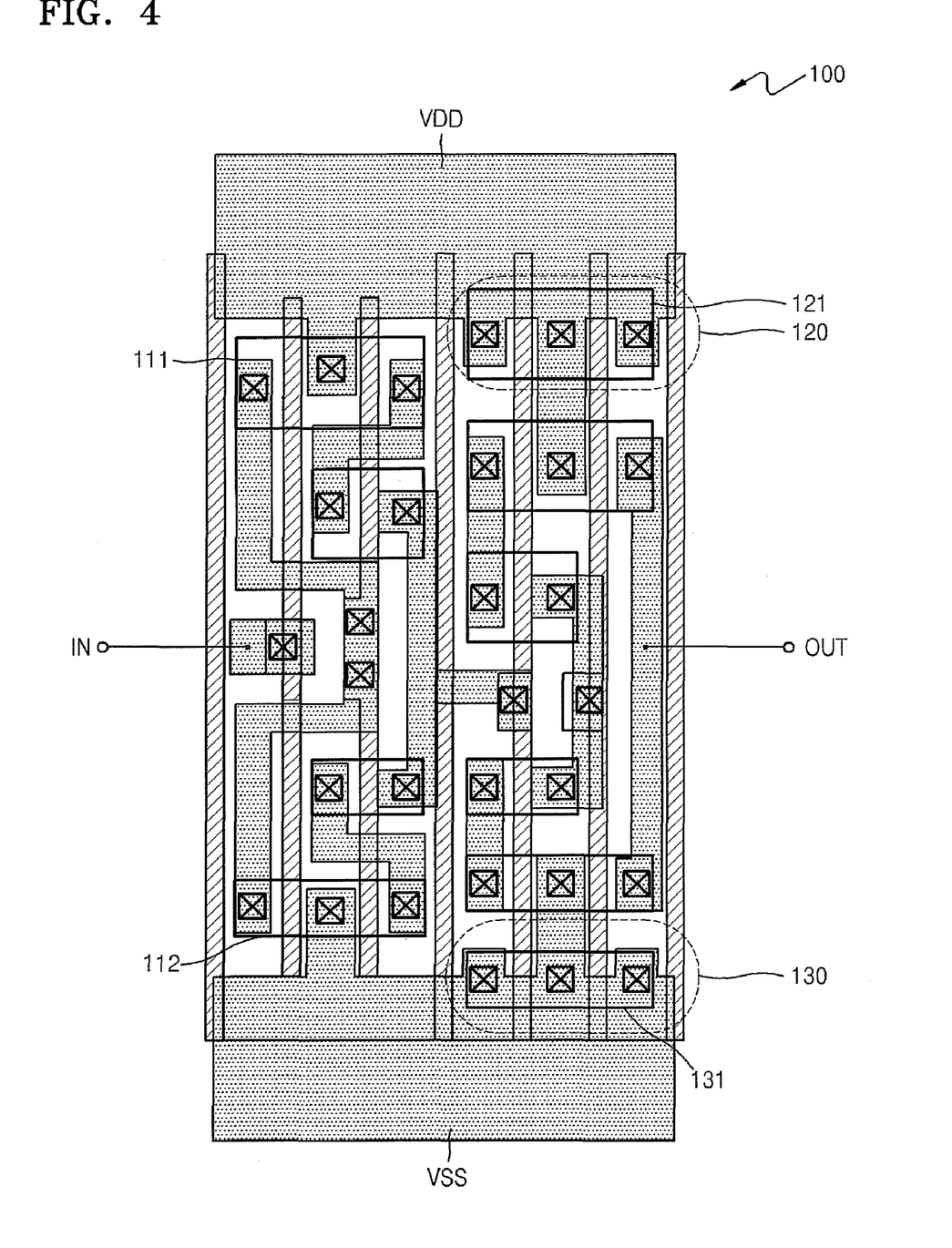
FIG. 4 shows a layout for implementing the delay circuit of FIG. 3.

FIG. 4 shows a layout for implementing the delay circuit of FIG. 3. Referring to FIG. 4, to implement the delay circuit 100 of FIG. 3, a conductive line supplying a supply voltage VDD, a conductive line supplying a ground voltage VSS, polymer lines forming a gate electrode and a dummy line, at least one active region, and various conductive lines for forming a transistor and a capacitor of the delay circuit 100 may be arranged in the delay circuit 100. The conductive line may be a metal line. In addition, a plurality of contacts may be arranged in the delay circuit 100 to electrically connect the conductive line with the polymer line, or the conductive line with the active region.

A variety of layouts for implementing practical inverter circuit units 110 may be designed based on the circuit shown in FIG. 3. That is, the active region, the gate electrode, the conductive line, and the like may be connected to each other through contacts to implement the inverter circuit unit 110. For example, a first active region 111 is formed adjacent to the conductive line supplying the supply voltage VDD, and electrically connected to the supply voltage VDD through the contact. In addition, at least one gate electrode may be aligned so as to cross the first active region 111, and the conductive line forming a source electrode or a drain electrode is electrically connected to the first active region 111. Based on the layout described above, at least one PMOS transistor is formed in the inverter circuit unit 110.

Similarly, a second active region 112 is formed adjacent to the conductive line supplying the ground voltage VSS, and electrically connected to the ground voltage VSS through the contact. In addition, at least one gate electrode may be aligned so as to cross the second active region 112, and in an exemplary embodiment the gate electrode may be aligned so as to cross both of the first active region 111 connected to the supply voltage VDD and the second active region 112 connected to the ground voltage VSS. At least one NMOS transistor is formed in the inverter circuit unit 110 by electrically connecting the conductive line forming a source electrode or a drain electrode with the second active region 112.

Generally, if a semiconductor chip is designed using a standard cell, the size of the cell is standardized. If the inverter circuit unit 110 is designed using the standard cell, a portion of the cell in which the circuit is not aligned is empty. The delay circuit 100 according to the current embodiment includes at least one capacitor in addition to the inverter circuit unit 110. Thus, the at least one capacitor may be designed so as to be aligned in the empty space of the standard cell in which the circuit is not aligned.

As shown in FIG. 4, the first active region 111 is formed in one portion adjacent to the conductive line supplying the supply voltage VDD. The other portion adjacent to the conductive line is empty since the circuit for implementing the inverter circuit unit 110 is not aligned therein. The capacitor unit 120, which includes at least one PMOS transistor (C1, C2) among the capacitors shown in FIG. 3 is formed in the empty space adjacent to the conductive line supplying the supply voltage VDD. For this, a third active region 121 for aligning the capacitors C1, C2 is further formed in the empty space.

As shown in FIG. 4, the third active region 121 is connected to the conductive line supplying the supply voltage VDD through at least one contact. For example, the third active region 121 is connected to the conductive line supplying the supply voltage VDD through three contacts. In addition, two gate lines may be aligned so as to cross the third active region 121. Accordingly, one gate line and conductive lines adjacent to both sides of the gate line may form the capacitor C1. Another gate line and conductive lines adjacent to both sides of the gate line may also form the capacitor C2.

Similarly, the second active region 112 is formed in one portion adjacent to the conductive line supplying the ground voltage VSS. The other portion adjacent to the conductive line is empty since the circuit for implementing the inverter circuit unit 110 is not aligned therein. The capacitor unit 130, which includes at least one NMOS transistor (C3, C4), among the capacitors shown in FIG. 3 are formed in the empty space adjacent to the conductive line connected to the ground voltage VSS. For this, a fourth active region 131 for aligning the capacitors C3, C4 is further formed in the empty space.

To form the capacitors C3, C4 on the fourth active region 131, the fourth active region 131 is connected to the conductive line supplying the ground voltage VSS through at least one contact. For example, the fourth active region 131 is connected to the conductive line supplying the ground voltage VSS through three contacts to form two capacitors C3, C4. In addition, two gate lines may be aligned so as to cross the fourth active region 131. Accordingly, one gate line and conductive lines adjacent to both sides of the gate line may form the capacitor C3. Another gate line and conductive lines adjacent to both sides of the gate line may also form the capacitor C4.

As shown in FIG. 4, a length of the gate lines forming the gate electrode of the transistors and one electrode of the capacitor for the delay circuit 100 may be controlled to have the minimum feature size. In addition, the gate line aligned so as to cross the third active region 121 to form the capacitors C1, C2, which are PMOS transistors, and the gate line aligned so as to cross the fourth active region 131 to form the capacitors C3, C4, which are NMOS transistors may be the same. Accordingly, as shown in FIGS. 3 and 4, one electrode of the capacitor C1 and one electrode of the capacitor C3 are connected to the gate electrode (the input terminal of the third inverter) of the transistors P4, P5, N4, N5 which are formed in other active regions besides the third and fourth active regions 121, 131. In addition, one electrode of the capacitor C2 and one electrode of the capacitor C4 are connected to the gate electrode (the input terminal of the fourth inverter) of the transistors P6, N6.

Figure 5:
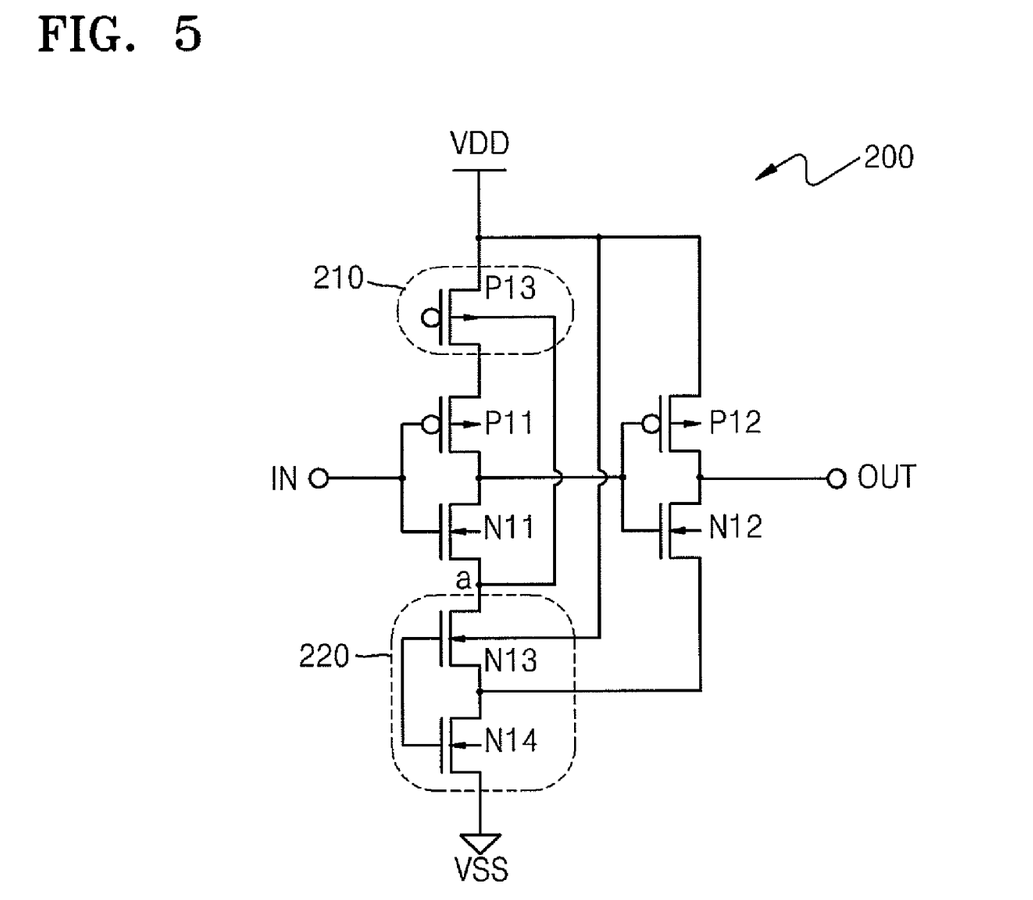
FIG. 5 shows a circuit diagram of a delay circuit according to another exemplary embodiment of the present invention.

FIG. 5 shows a circuit diagram of a delay circuit according to another embodiment of the present invention. In particular, the delay time of the delay circuit 200 shown in FIG. 5 is increased by increasing the resistance thereof.

As shown in FIG. 5, the delay circuit 200 includes an inverter circuit unit including at least one CMOS inverter. For example, the inverter circuit unit may include two inverter stages, and the first inverter stage may include a PMOS transistor P11 which operates as a pull-up transistor and is connected to a supply voltage VDD, and an NMOS transistor N11 which operates as a pull-down transistor and is connected to a ground voltage VSS. In addition, the first inverter stage may include a PMOS transistor P12 which operates as a pull-up transistor and is connected to a supply voltage VDD, and an NMOS transistor N12 which operates as a pull-down transistor and is connected to a ground voltage VSS. The inverter circuit unit receives an input signal IN and outputs an output signal OUT by delaying the input signal IN for a predetermined period of time.

The delay circuit 200 includes at least one resistance unit connected to the inverter circuit unit to increase the delay time. The resistance unit may be connected to at least one inverter among the inverters in the inverter circuit unit. Referring to FIG. 5, the resistance unit is connected to the first inverter stage. In particular, a first resistance unit 210 may be formed between the supply voltage VDD and the pull-up transistor P11, and a second resistance unit 220 may be formed between the ground voltage VSS and the pull-down transistor N11.

The resistance unit may be implemented using at least one MOS transistor. As shown in FIG. 5, the first resistance unit 210 formed between the supply voltage VDD and the pull-up transistor P11 may be a PMOS transistor P13, and the second resistance unit 220 formed between the ground voltage VSS and the pull-down transistor N11 may be implemented using NMOS transistors N13, N14. The delay circuit 200 may be modified in various forms by those of ordinary skill in the art, and the scope of the present invention is not limited to the embodiment shown in FIG. 5. For example, the inverter circuit unit may include additional inverter stages. Furthermore, FIG. 5 illustrates that the first resistance unit 210 includes a single PMOS transistor P13, and the second resistance unit 220 includes two NMOS transistors N13, N14, but the present invention is not limited thereto.

A resistance unit which includes a MOS transistor needs to function as a resistance regardless of the status of the input signal IN provided by the delay circuit. That is, the resistance unit needs to have a predetermined turn-on resistance value by always turning on the PMOS transistor P13 and the NMOS transistors N13, N14 regardless of the status of the input signal IN.

The operation of the resistance unit will now be described in more detail. A gate electrode of the NMOS transistor N13 of the second resistance unit 220 is directly connected to the supply voltage VDD. The gates of NMOS transistors N13, N14 are connected. Accordingly, the NMOS transistors N13, N14 are always turned on and function as a resistance. In addition, since the NMOS transistors N13, N14 are turned on, the voltage level of node a is decreased to that of the ground voltage VSS. The gate electrode of the PMOS transistor P13 of the first resistance unit 210 is connected to the node a, and the PMOS transistor P13 is turned on and functions as a resistance since the voltage level of the node a is decreased to that of the ground voltage VSS.

FIG. 5 illustrates that the gate electrode of the PMOS transistor P13 of the first resistance unit 210 is connected to the node a, but the present invention is not limited thereto. To always turn on the PMOS transistor P13, the ground voltage VSS may be connected to the gate electrode of the PMOS transistor P13. For this, a node formed between the NMOS transistor N13 and the NMOS transistor N14 may be connected to the gate electrode of the PMOS transistor P13. Alternatively, a node formed between the NMOS transistor N14 and the ground voltage VSS may be connected to the gate electrode of the PMOS transistor P13.

When the delay time of the delay circuit is increased by raising the resistance as described above, the amount of the delay time may be less than that obtained by increasing the capacitance. However, the delay circuit 200 has better power consumption properties as compared to the case where the capacitance is increased. That is, since power consumption P is calculated using a formula $\frac{1}{2}CV^2$, power consumption is increased when the capacitance is increased, whereas the power consumption is not changed when the delay time is increased by increasing the resistance.

Figure 6:
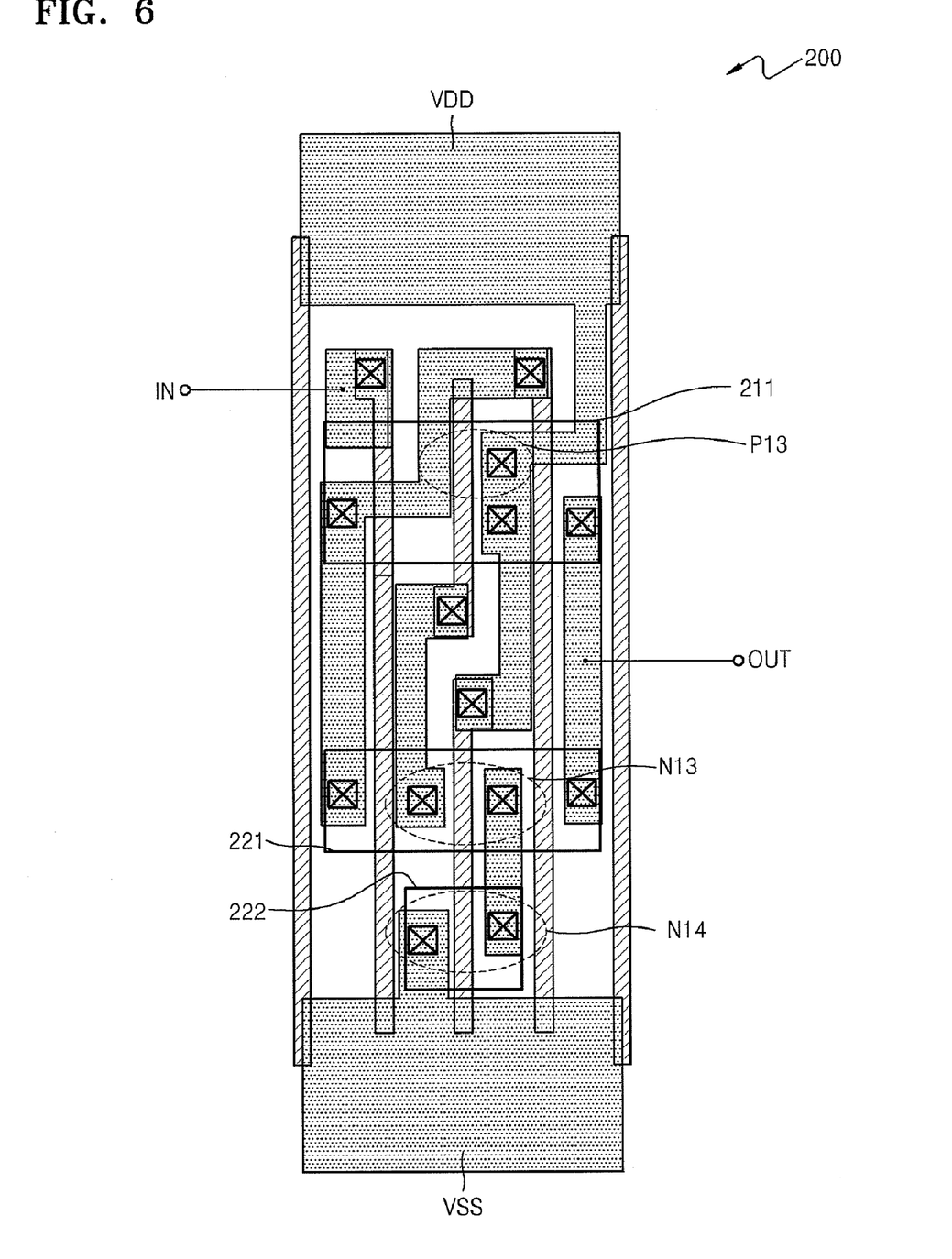
FIG. 6 shows a layout for implementing the delay circuit of FIG. 5.

FIG. 6 shows a layout for implementing the delay circuit of FIG. 5. To implement the delay circuit 200 shown in FIG. 5, a conductive line supplying a supply voltage VDD, a conductive line supplying a ground voltage VSS, polymer lines forming a gate electrode and a dummy line, at least one active region, a plurality of contacts, and various conductive lines forming a transistor and a resistance unit of the delay circuit 200 may be arranged in the delay circuit 200 as shown in FIG. 6. The layout shown in FIG. 6 is an exemplary embodiment of the present invention, and those skilled in the art would appreciate that the delay circuit 200 of FIG. 5 may be implemented using various other layouts.

First, a first active region 211 may be formed adjacent to the conductive line supplying the supply voltage VDD. In addition, the gate line is aligned so as to cross the first active region 211 to form a PMOS transistor P13 of a first resistance unit 210, and conductive lines are aligned on both sides of the gate line. A conductive line corresponding to a source electrode of the PMOS transistor P13 is connected to the conductive line supplying the supply voltage VDD, and a conductive line corresponding to a drain electrode of the PMOS transistor P13 is connected to a conductive line corresponding to a source electrode of a pull-up transistor P11.

In addition, a second active region 221 and a third active region 222 may be formed adjacent to the conductive line supplying the ground voltage VSS. In addition, the gate line is aligned so as to cross the second active region 221 and the third active region 222 to form the NMOS transistors N13, N14 of the second resistance unit 220, and conductive lines are aligned on both sides of the gate line.

As shown in FIG. 6, the NMOS transistor N13 is formed by the gate line aligned in the second active region 221 and the conductive lines aligned on both sides of the gate line. In addition, the NMOS transistor N14 is formed by the gate line aligned in the third active region 222 and the conductive lines aligned on both sides of the gate line. The drain electrode of the NMOS transistor N13 is formed of the same conductive line forming the source electrode of the pull-down transistor N11, and the source electrode of the NMOS transistor N13 and the drain electrode of the NMOS transistor N14 are formed of the same conductive line. In addition, the source electrode of the NMOS transistor N14 may be formed of the conductive line supplying the ground voltage VSS.

Further, for the PMOS transistor P13 and the NMOS transistors N13, N14 to be always turned on as shown in FIG. 6, the gate line forming the NMOS transistors N13, N14 is directly connected to the conductive line supplying the supply voltage VDD through contacts. In addition, the gate line forming the PMOS transistor P13 is connected to the drain electrode (node a of FIG. 5) of the NMOS transistor N13 through contacts. According to this layout, the PMOS transistor P13 and the NMOS transistors N13, N14 are always turned on and function as a resistance.

Figure 7:
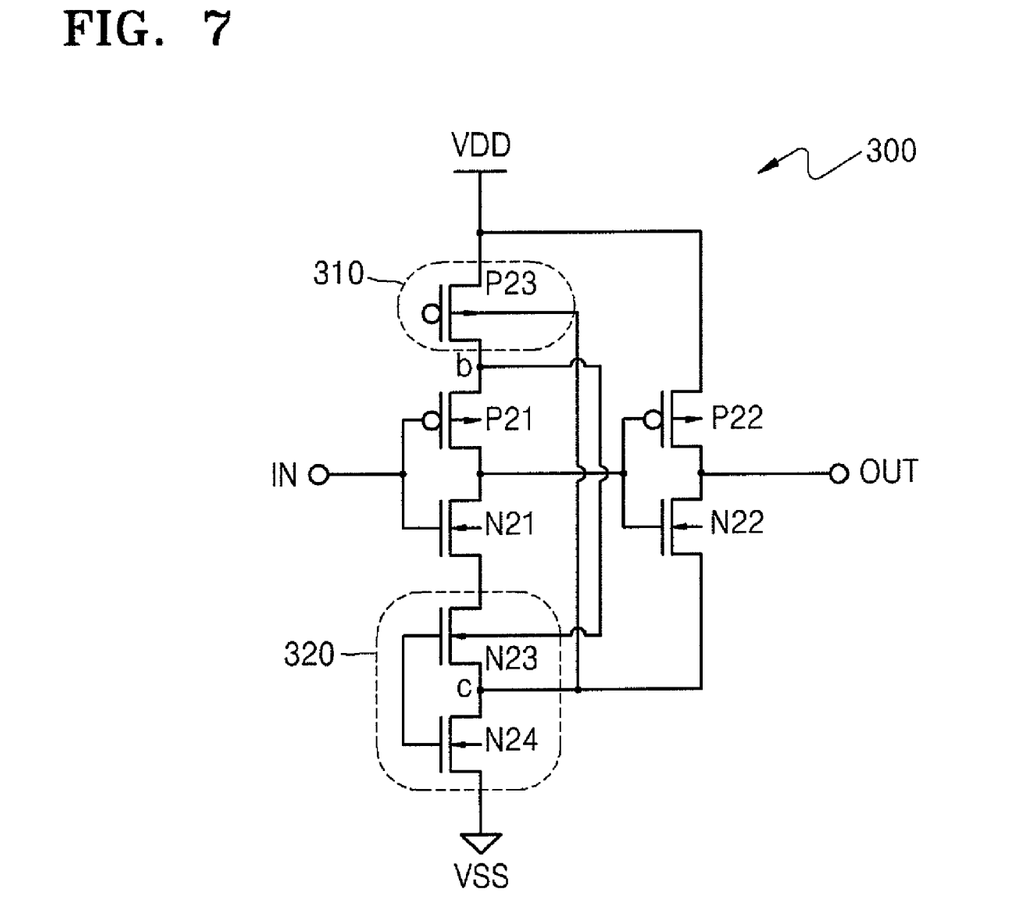
FIG. 7 shows a circuit diagram of a delay circuit according to yet another exemplary embodiment of the present invention.

FIG. 7 shows a circuit diagram of a delay circuit 300 according to another embodiment of the present invention. In case of the delay circuit 300 shown in FIG. 7, the delay time is increased by increasing the resistance thereof. In particular, in the delay circuit 200 of FIG. 5, the gate may be damaged due to an electrostatic discharge (ESD) since the NMOS transistors N13, N14 are directly connected to the supply voltage VDD. To prevent such damage, the delay circuit 200 of FIG. 5 may be modified to have a layout of the delay circuit 300 shown in FIG. 7. Accordingly, the NMOS transistor N13 would then not be directly connected to the supply voltage VDD. Elements of the delay circuit of FIG. 7 which are the same and described with reference to FIG. 5 will not be further described.

As shown in FIG. 7, the delay circuit 300 may include an inverter circuit unit including at least one CMOS inverter. For example, the inverter circuit unit may include two inverter stages. A first inverter stage includes a PMOS transistor P21 and an NMOS transistor N21, and a second inverter stage includes a PMOS transistor P22 and an NMOS transistor N22.

The first resistance unit 310 may include a PMOS transistor P23, and the second resistance unit 320 may include NMOS transistors N23, N24. The PMOS transistor P23 may be formed between the supply voltage VDD and the a pull-up transistor P21, and the NMOS transistors N23, N24 may be formed in series between the ground voltage VSS and the pull-down transistor N21. The PMOS transistor P23 and the NMOS transistors N23, N24 are always turned on regardless of the status of the input signal IN to have a predetermined resistance value.

The gate electrode of the PMOS transistor P23 of the first resistance unit 310 is connected to a node c formed between the NMOS transistors N23, N24. In addition, the gate electrode of the NMOS transistors N23, N24 of the second resistance unit 320 may be connected to a node b formed between the PMOS transistor P23 and the pull-up transistor P21. The gate electrode of the PMOS transistor P23 may be connected to any other node to which the ground voltage VSS is supplied. However, the gate electrode of the NMOS transistors N23, N24 is not directly connected to the supply voltage VDD to prevent damage due to ESD.

The operation of the delay circuit 300 of FIG. 7 will now be described.

First, if the PMOS transistor P23 and the NMOS transistors N23, N24 are turned on in the initial operational stage, the transistors normally operate as resistance devices.

If the PMOS transistor P23 is turned on and the NMOS transistors N23, N24 are turned off in the initial operational stage, the voltage of the node b is increased to that of the supply voltage VDD since the PMOS transistor P23 is turned on. Due to the increased voltage of the node b, the NMOS transistors N23, N24 are turned on, and thus the PMOS transistor P23 and the NMOS transistors N23, N24 normally operate as resistance devices.

If the PMOS transistor P23 is turned off and the NMOS transistors N23, N24 are turned on in the initial operational stage, the voltage of the node c is decreased to the ground voltage VSS since the NMOS transistor N24 is turned on. Due to the decreased voltage of the node c, the PMOS transistor P23 is turned on, and thus the voltage of the node b is increased to the supply voltage VDD. Due to the increased voltage of the node b, the NMOS transistors N23, N24 are strongly turned on.

If the PMOS transistor P23 and the NMOS transistors N23, N24 are all turned off in the initial operational stage, the process is as follows. Since all of the transistors are turned off, the voltage of the node b is equal to the ground voltage VSS, and the voltage of the node c is equal to the supply voltage VDD. It can be assumed that there in no leakage current in ideal transistors. However, leakage current occurs in real transistors. Thus, the voltage of the node b becomes greater than that of the ground voltage VSS due to the leakage current of the PMOS transistor P23, and the voltage of the node c becomes lower than that of the supply voltage VDD due to the leakage current of the NMOS transistors N23, N24 with lapse of time.

As the amount of the leakage current is increased, the voltage of the node b becomes greater than a threshold voltage of the NMOS transistors N23, N24, and thus the NMOS transistors N23, N24 are slightly turned on. Furthermore, the voltage of the node c becomes lower than a threshold voltage of the PMOS transistor P23, and thus the PMOS transistor P23 is weakly turned on. Then, the voltage of the node b is increased to that of the supply voltage VDD due to the turned on MOS transistors, and the voltage of the node c is decreased to the level of the ground voltage VSS. Thus, the PMOS transistor P23 and the NMOS transistors N23, N24 are strongly turned on.

Figure 8:
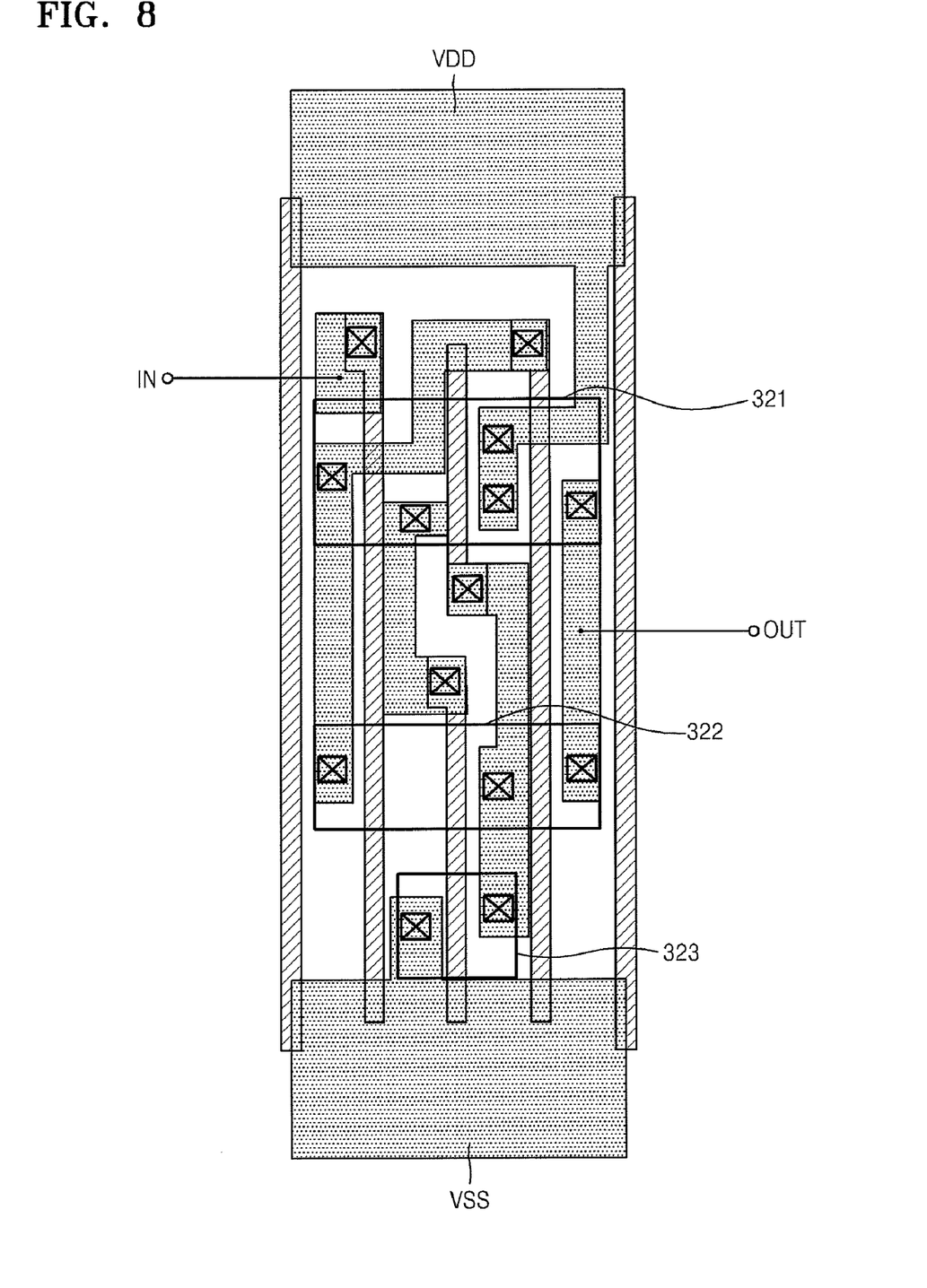
FIG. 8 shows a layout for implementing the delay circuit of FIG. 7.

FIG. 8 shows a layout for implementing the delay circuit of FIG. 7. As shown in FIG. 8, a conductive line supplying a supply voltage VDD, a conductive line supplying a ground voltage VSS, at least one polymer line forming a gate electrode and a dummy line, at least one active region, a plurality of contacts, and various conductive lines forming a transistor and a resistance unit of the delay circuit 300 may be arranged.

As shown in FIG. 8, the PMOS transistor P23 is formed by a gate line and a conductive line aligned in a first active region 321, and the NMOS transistor N23 is formed by a gate line and a conductive line aligned in a second active region 322. In addition, the NMOS transistor N24 is formed by a gate line and a conductive line aligned in the third active region 323.

Further, the gate line forming the PMOS transistor P23 is connected to a source electrode of the NMOS transistor N23 and a drain electrode of the NMOS transistor N24 through contacts. Also, the gate line forming the NMOS transistors N23 and N24 is connected to a drain of the PMOS transistor P23 through contacts. The layout shown in FIG. 8 is an exemplary embodiment of the present invention, and those skilled in the art would appreciate that the delay circuit 300 of FIG. 7 may be implemented using various other layouts.

Exemplary embodiments of the present invention are provided to fully describe the delay circuit, but the scope of the present invention is not limited thereto. Those skilled in the art would appreciate that the embodiments of the present invention can also be applied to semiconductor devices which include the delay circuit.

According to at least on embodiment of the present invention, characteristics variations of the transistors can be minimized by maintaining the length of the gate for the delay circuit to the minimum feature size, and delay time can be maximized with a small area.

While exemplary embodiments of the present invention have been shown and described, it will be understood that various changes in form and details may be made therein without departing from the spirit and scope of the following claims.

What is claimed is:

1. A delay circuit delaying an input signal and generating an output signal, the delay circuit being aligned within a standard cell having a standardized size, comprising:
a first active region electrically connected to a supply voltage, a first transistor of a first inverter is aligned in the first active region;
a second active region electrically connected to a ground voltage, a second transistor of the first inverter is aligned in the second active region;
a third active region in which a first capacitor is aligned, the first capacitor providing a first loading capacitance to an input node of the first inverter, and
a first gate line crossing the first through third active regions and forming gate electrodes of the first and second transistors and a first electrode of the first capacitor.

2. The delay circuit of claim 1, further comprising a fourth active region in which a second capacitor is aligned, the second capacitor providing a second loading capacitance to the input node of the first inverter,
wherein the third active region is electrically connected to the supply voltage and the fourth active region is electrically connected to the ground voltage.

3. The delay circuit of claim 2, wherein the first gate line further crosses the fourth active region.

4. The delay circuit of claim 2, wherein a first and second conductive lines are aligned adjacent to both edges of the standard cell respectively, the first conductive line providing the supply voltage and the second conductive line providing the ground voltage,
the third and fourth active regions are aligned adjacent to the first and second conductive lines respectively, and the first and second active regions are aligned between the third and fourth active regions.

5. The delay circuit of claim 1, further comprising a second gate line crossing the first through third active regions and forming a second inverter and a third capacitor, the third capacitor providing a third loading capacitance to, an input node of the second inverter.

6. The delay circuit of claim 5, wherein a length of the first gate line and a length of the second gate line have a minimum feature size.

7. A delay circuit comprising:
an inverter circuit unit comprising at least one inverter stage, each inverter stage comprising:
a pull-up transistor that switches a first voltage, and
a pull-down transistor that switches a second voltage, the pull-down transistor being coupled in series to the pull-up transistor; and
a resistance unit connected to at least one inverter stage and having a predetermined resistance independent of an input signal to the inverter circuit unit,
wherein the inverter circuit unit, in response to receiving the input signal, outputs an output signal having a delay from the input signal, the delay corresponding to the predetermined resistance,
wherein the resistance unit includes at least one PMOS transistor connected between the first voltage and the pull-up transistor and at least one NMOS transistor connected between the second voltage and the pull-down transistor,
wherein a gate electrode of the at least one NMOS transistor is directly connected to the first voltage and a gate electrode of the at least one PMOS transistor is connected to a node between the pull-down transistor and second voltage,
wherein the first voltage is a supply voltage, and the second voltage is a ground voltage,
wherein the at least one PMOS transistor comprises a first PMOS transistor connected between the first voltage and the pull-up transistor,
wherein the at least one NMOS transistor comprises a first NMOS transistor and a second NMOS transistor connected in series between the second voltage and the pull-down transistor, and
wherein:
the gate of the first NMOS transistor is directly connected to the first voltage,
the gate of the first NMOS transistor is connected to the gate of the second NMOS transistor, and
a gate of the first PMOS transistor is connected to a node between the pull-down transistor and the second voltage.

8. The delay circuit of claim 7, wherein the gate of the first PMOS transistor is connected to a node between the first NMOS transistor and the second NMOS transistor.

9. A delay circuit comprising:
an inverter circuit unit comprising at least one inverter stage, each inverter stage comprising:
a pull-up transistor that switches a first voltage, and
a pull-down transistor that switches a second voltage, the pull-down transistor being coupled in series to the pull-up transistor; and
a resistance unit connected to at least one inverter stage and having a predetermined resistance independent of an input signal to the inverter circuit unit,
wherein the inverter circuit unit, in response to receiving the input signal, outputs an output signal having a delay from the input signal, the delay corresponding to the predetermined resistance,
wherein the resistance unit includes at least one PMOS transistor connected between the first voltage and the pull-up transistor and at least one NMOS transistor connected between the second voltage and the pull-down transistor, wherein a gate electrode of the at least one NMOS transistor is directly connected to the first voltage and a gate electrode of the at least one PMOS transistor is connected to a node between the pull-down transistor and second voltage, wherein the first voltage is a supply voltage, and the second voltage is a ground voltage, wherein the at least one PMOS transistor comprises a first PMOS transistor connected between the first voltage and the pull-up transistor, wherein the at least one NMOS transistor comprises a first NMOS transistor and a second NMOS transistor connected in series between the second voltage and the pull-down transistor, and wherein:
a gate of the first NMOS transistor and a gate of the second NMOS transistor are connected to a node between the pull-up transistor and the first PMOS transistor, and a gate of the first PMOS transistor is connected to a node between the pull-down transistor and the second voltage.

10. The delay circuit of claim 9, wherein the gate of the first PMOS transistor is connected to a node between the first NMOS transistor and the second NMOS transistor.

* * * * *